(12) United States Patent
Kingsborough et al.

(10) Patent No.: US 7,344,913 B1
(45) Date of Patent: Mar. 18, 2008

(54) SPIN ON MEMORY CELL ACTIVE LAYER DOPED WITH METAL IONS

(75) Inventors: Richard P. Kingsborough, North Chelmsford, MA (US); William Leonard, Brookline, MA (US); Igor Sokolik, East Boston, MA (US); Stuart Spitzer, Lynnfield, MA (US); Zhida Lan, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 310 days.

(21) Appl. No.: 11/099,847

(22) Filed: Apr. 6, 2005

(51) Int. Cl.
*H01L 51/40* (2006.01)

(52) U.S. Cl. ............... 438/99; 438/622; 438/681; 438/687; 438/762; 438/780

(58) Field of Classification Search ............ 438/99, 438/622, 681, 687, 762, 780
See application file for complete search history.

(56) References Cited

U.S. PATENT DOCUMENTS

| | | |
|---|---|---|
| 4,663,270 A | 5/1987 | Potember et al. |
| 5,589,692 A | 12/1996 | Reed |
| 6,055,180 A | 4/2000 | Gudesen et al. |
| 6,208,553 B1 | 3/2001 | Gryko et al. |
| 6,212,093 B1 | 4/2001 | Lindsey |
| 6,272,038 B1 | 8/2001 | Clausen et al. |
| 6,314,019 B1 | 11/2001 | Kuekes et al. |
| 6,320,200 B1 | 11/2001 | Reed et al. |
| 6,324,091 B1 | 11/2001 | Gryko et al. |
| 6,348,700 B1 | 2/2002 | Ellenbogen et al. |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B2 | 7/2004 | Krieger et al. |
| 6,770,905 B1 | 8/2004 | Buynoski et al. |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 6,852,586 B1 | 2/2005 | Buynoski et al. |
| 6,858,481 B2 | 2/2005 | Krieger et al. |
| 6,864,522 B2 | 3/2005 | Krieger et al. |
| 7,148,144 B1* | 12/2006 | Avanzino ............... 438/687 |
| 2004/0159835 A1* | 8/2004 | Krieger et al. ............ 257/40 |
| 2005/0058009 A1* | 3/2005 | Yang et al. ............. 365/232 |
| 2005/0211978 A1* | 9/2005 | Bu et al. ................. 257/40 |

* cited by examiner

*Primary Examiner*—Zandra V. Smith
*Assistant Examiner*—Bac H. Au
(74) *Attorney, Agent, or Firm*—Amin, Turocy & Calvin, LLP

(57) ABSTRACT

A method of making organic memory cells made of two electrodes with a controllably conductive media between the two electrodes is disclosed. The controllably conductive media contains an active layer and passive layer. The active layer is formed using spin on techniques and contains an organic semiconductor doped with a metal salt.

20 Claims, 2 Drawing Sheets

SPIN ON MEMORY CELL ACTIVE LAYER DOPED WITH METAL IONS

TECHNICAL FIELD

The subject invention generally relates to organic memory devices and methods of making the organic memory devices. In particular, the subject invention relates to using spin on techniques and to make an active layer containing a polymer and a metal salt.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper-involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Specifically, scaling inorganic solid state devices raises issues with dopant diffusion lengths. For example, as dimensions are reduced, the dopant diffusion lengths in silicon are posing difficulties in process design.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides organic memory devices where the active layer contains a metal salt, and thus the active layer has relatively high initialization voltages compared to active layers that do not contain metal salts. Inclusion of the metal salt in the active layer improves cyclic stability during the useful lifetime of the resultant memory cells containing the active layer. The subject invention also provides organic memory devices that possess one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the subject invention relates to a method of making an organic memory cell involving providing a first electrode; forming a passive layer over the first electrode; forming an active layer over the passive layer using a spin-on technique, the spin-on technique involving applying a mixture of i) an organic semiconductor material, ii) an inorganic metal salt, and iii) at least one solvent selected from the group consisting of glycol ether esters, glycol ethers, furans, and alkyl alcohols containing from about 4 to about 7 carbon atoms; and providing a second electrode over the active layer. Spin-on techniques permit forming the active layer in a reliable, robust and efficient manner.

Another aspect of the subject invention relates to an organic memory cell containing a first electrode; a passive layer over the first electrode; an active layer over the passive layer made by using a spin-on technique, the active layer containing an organic semiconductor material and a metal salt; and a second electrode over the active layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention involves organic memory cells made of two electrodes with a controllably conductive media between the two electrodes. The controllably conductive media contains an active layer and passive layer. The active layer contains a metal salt and polymer and is made using spin-on techniques, which permits the formation of inexpensive, efficient, and high quality controllably conductive layers compared to using chemical vapor deposition techniques. Since the active layer contains a metal salt, relatively high initialization voltages are realized compared to active layers that do not contain metal salts.

The organic memory cells may optionally contain additional layers, such as additional electrodes, charge retention layers, and/or chemically active layers. The impedance of the controllably conductive media changes when an external stimuli such as an applied electric field is imposed. A plurality of organic memory cells, which may be referred to as an array, form an organic memory device. In this connection, organic memory cells may form an organic memory devices and function in a manner analogous to metal oxide semiconductor field effect transistors (MOSFETs) in conventional semiconductor memory devices. However, there are advantages to using the organic memory cells instead of conventional MOSFETs in memory devices.

Figure 1:
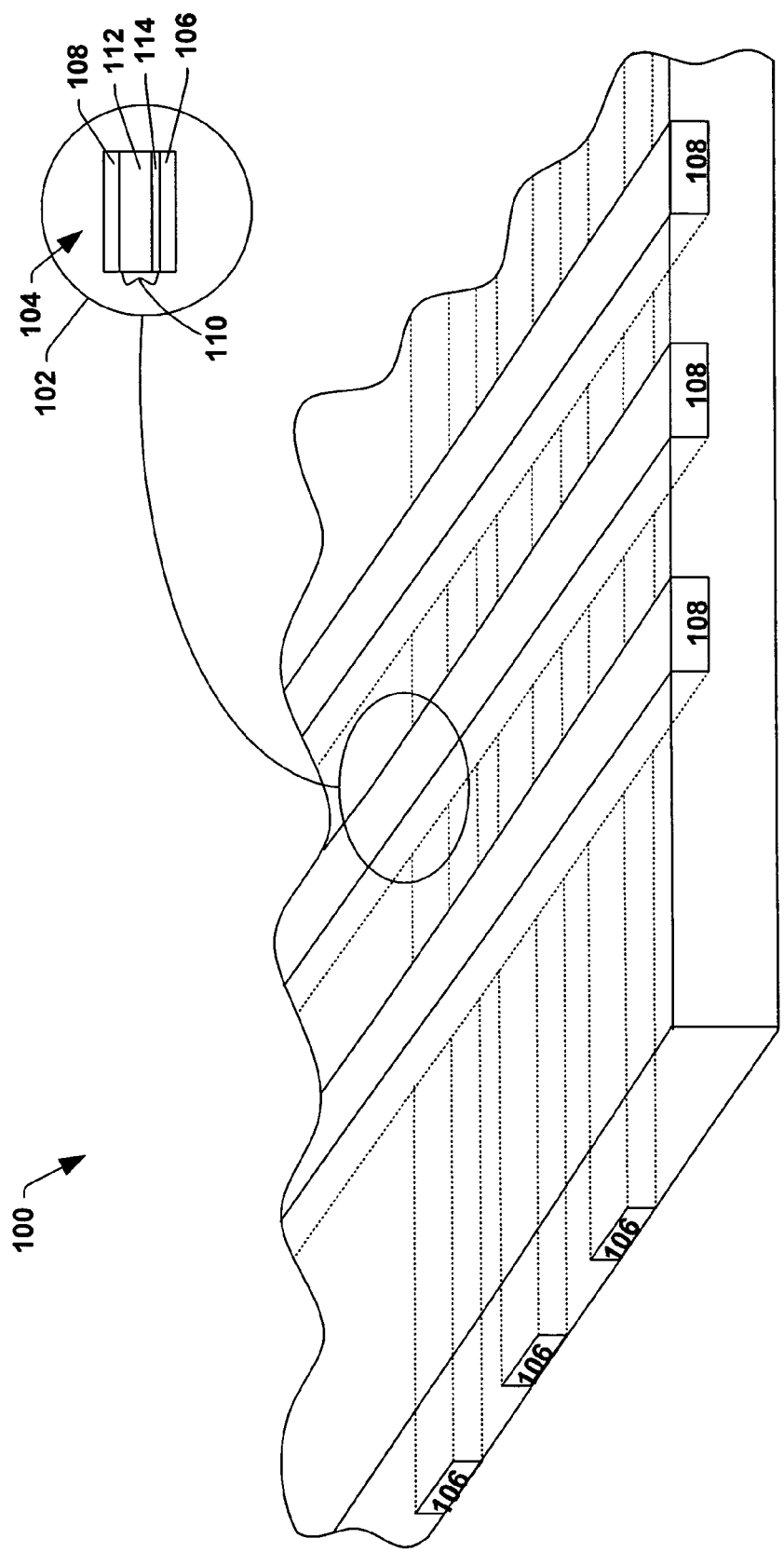
FIG. 1 illustrates a perspective view of a two dimensional microelectronic device containing a plurality of organic memory cells in accordance with one aspect of the invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an active layer 112 containing a organic semiconductor/polymer and a metal salt and a passive layer 114 containing a conductivity facilitating compound. Peripheral circuitry and devices are not shown for brevity.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more active layers and one or more passive layers. In one embodiment, the controllably conductive media contains at least one active layer that is adjacent a passive layer (without any intermediary layers between the active layer and passive layer).

The active layer contains at least one metal salt and at least one of an organic polymer (such as a conjugated organic polymer), an organometallic polymer (such as a conjugated organometallic polymer), a buckyball, a carbon nanotube (such as a C6-C60 carbon nanotubes), and the like (collectively referred to as organic semiconductors). Organic semiconductors thus have a carbon based structure, often a carbon-hydrogen based structure, which is different from conventional MOSFETs. The organic semiconductor materials are typically characterized in that they have overlapping $\pi$ orbitals, and/or in that they have at least two stable oxidation states. The organic semiconductor materials are also characterized in that they may assume two or more resonant structures. The overlapping $\pi$ orbitals contribute to the controllably conductive properties of the controllably conductive media. The amount of charge injected into the active layer also influences the degree of conductivity of the active layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a Buckminsterfullerene, a soccerball-shaped 60-atom cluster of pure carbon.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping $\pi$ orbitals. Conjugated polymers are also characterized in that they may assume two or more resonant structures. The conjugated nature of the conjugated organic polymer contributes to the controllably conductive properties of the controllably conductive media.

In this connection, the active layer, such as a conjugated organic polymer and a metal salt, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity facilitating compound. The ability of the active layer to donate and accept charges and electrically interact with the passive layer also depends on the identity of the metal salt and the conductivity facilitating compound.

The organic polymers (or the organic monomers constituting the organic polymers) may be cyclic or acyclic. During formation or deposition, the organic polymer self assembles between the electrodes. Examples of conjugated organic polymers and conjugated organometallic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis (trifluoromethyl)acetylene; polybis(t-butyldiphenyl) acetylene; poly(trimethylsilyl)diphenylacetylene; poly (carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polyfluorene; polyphenylene and alkyl- or alkoxy-substituted derivates thereof, polythiophene and alkyl- or alkoxy-substituted derivates thereof; polypyrrole; polysilane; polystyrene; polyfuran; polyindole; polyazulene; polyphenylene; polyfluorenes, polypyridine; polybipyridine; polyphthalocyanine; polysexithiophene; poly(silicon-oxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like. Examples further include any co-polymers, ter-polymers, etc. that contain repeating units of any of the above-mentioned polymers combined with units that are not listed herein.

The metal salts doped into the active layer are capable of providing metal ions into the active layer. The metal salts are typically transition metal halogens, sulfates, persulfates, nitrates, phosphates, and the like. Examples of metal salts include copper halogens, sulfate, persulfate, nitrate, and phosphate; manganese halogens, sulfate, persulfate, nitrate, and phosphate; titanium halogens, sulfate, persulfate, nitrate, and phosphate; indium halogens, sulfate, persulfate, nitrate, and phosphate; gold halogens, sulfate, persulfate, nitrate, and phosphate; silver halogens, sulfate, persulfate, nitrate, and phosphate; iron halogens, sulfate, persulfate, nitrate, and phosphate; cobalt halogens, sulfate, persulfate, nitrate, and phosphate; nickel halogens, sulfate, persulfate, nitrate, and phosphate; palladium halogens, sulfate, persulfate, nitrate, and phosphate; platinum halogens, sulfate, persulfate, nitrate, and phosphate; zirconium halogens, sulfate, persulfate, nitrate, and phosphate; zinc halogens, sulfate, persulfate, nitrate, and phosphate; tungsten halogens, sulfate, persulfate, nitrate, and phosphate; molybdenum halogens, sulfate, persulfate, nitrate, and phosphate; and osmium halogens, sulfate, persulfate, nitrate, and phosphate. These exemplary metal salts provide copper ions, manganese ions, titanium ions, indium ions, gold ions, silver ions, iron ions, cobalt ions, nickel ions, palladium ions, platinum ions, zirconium ions, zinc ions, tungsten ions, molybdenum ions, and osmium ions into the active layer. In one embodiment, the metal salts are inorganic metal salts (the metal cation and anion do not have an organic moiety).

The active layer is formed by spin-on techniques (depositing a mixture of the polymer/polymer precursor, metal salt, and a solvent, then removing the solvent from the substrate/electrode). During formation, the organic semiconductor material self assembles between the electrodes with the metal salt/metal ions dispersed thereabout. It is not typically necessary to functionalize one or more ends of the organic polymer in order to attach it to an electrode/passive layer. When using spin-on techniques, the solvent in which the polymer/polymer precursor is charged before application to the wafer structure is able to at least partially solubilize the polymer/polymer precursor and metal salt so that the active layer is formed in a substantially uniform manner over the surface of the substrate.

Solvents useful for this purpose include one or more of glycol ether esters, glycol ethers, furans, and alkyl alcohols containing from about 4 to about 7 carbon atoms. Two or more of glycol ether esters, glycol ethers, furans, and alkyl alcohols containing from about 4 to about 7 carbon atoms may be employed as a solvent system. The solvent system may contain one or more of glycol ether esters, glycol ethers, furans, and alkyl alcohols, and another organic solvent.

Examples of glycol ether esters include ethylene glycol methyl ether acetate, ethylene glycol ethyl ether acetate, ethylene glycol propyl ether acetate, ethylene glycol butyl ether acetate, propylene glycol methyl ether acetate, propylene glycol ethyl ether acetate, propylene glycol propyl ether acetate, propylene glycol butyl ether acetate, and the like.

Glycol ether esters also include polyalkylene glycol ether esters such as poly(ethylene glycol) alkyl ether acetates and poly(propylene glycol) alkyl ether acetates. Examples of poly(ethylene glycol) alkyl ether acetates and poly(propylene glycol) alkyl ether acetates include poly(ethylene glycol) methyl ether acetate, poly(ethylene glycol) ethyl ether acetate, poly(ethylene glycol) propyl ether acetate, poly (ethylene glycol) butyl ether acetate, poly(propylene glycol) methyl ether acetate, poly(propylene glycol) ethyl ether acetate, poly(propylene glycol) propyl ether acetate, and poly(propylene glycol) butyl ether acetate.

Additional specific examples of polyalkylene glycol ether esters include di(ethylene glycol) methyl ether acetate, di(ethylene glycol) ethyl ether acetate, di(ethylene glycol) propyl ether acetate, di(ethylene glycol) butyl ether acetate, di(ethylene glycol) hexyl ether acetate, di(ethylene glycol) dodecyl ether aceate, di(propylene glycol) methyl ether acetate, di(propylene glycol) ethyl ether acetate, di(propylene glycol) butyl ether acetate, tri(ethylene glycol) methyl ether acetate, tri(ethylene glycol) ethyl ether acetate, tri (ethylene glycol) butyl ether acetate, tri(propylene glycol) methyl ether acetate, tri(propylene glycol) butyl ether acetate, and the like.

Examples of glycol ethers include alkylene glycol ethers and polyalkylene glycol ethers, such as poly(ethylene glycol) methyl ether, poly(ethylene glycol) ethyl ether, poly (ethylene glycol) propyl ether, poly(ethylene glycol) butyl ether, poly(propylene glycol) methyl ether, poly(propylene glycol) ethyl ether, poly(propylene glycol) propyl ether, and poly(propylene glycol) butyl ether. Other examples of glycol ethers include ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, propylene glycol methyl ether, propylene glycol ethyl ether, propylene glycol butyl ether, propylene glycol dimethyl ether, propylene glycol diethyl ether, propylene glycol dibutyl ether, di(ethylene glycol) methyl ether, di(ethylene glycol) ethyl ether, di(ethylene glycol) butyl ether, di(ethylene glycol) hexyl ether, di(ethylene glycol) dimethyl ether, di(ethylene glycol) diethyl ether, di(ethylene glycol) dibutyl ether, di(ethylene glycol) butylmethyl ether, di(ethylene glycol) dodecyl ether, di(propylene glycol) methyl ether, di(propylene glycol) butyl ether, tri(ethylene glycol) methyl ether, tri(ethylene glycol) dimethyl ether, tri(propylene glycol) methyl ether, and tri(propylene glycol) butyl ether.

Furans include tetrahydrofuran. Alkyl alcohols containing from about 4 to about 7 carbon atoms specifically include alkyl alcohols containing from about 5 to about 6 carbon atoms. Examples of alkyl alcohols containing from about 4 to about 7 carbon atoms include n-butanol, iso-butanol, n-pentanol, iso-pentanol, cyclopentanol, n-hexanol, cyclohexanol, heptanol, and the like.

Using one or more of glycol ether esters, glycol ethers, furans, and alkyl alcohols containing from about 4 to about 7 carbon atoms, formation of the active layer is facilitated. In particular, forming the organic polymer in a direction away from the surface on which it is formed is facilitated, delivering the organic semiconductor material to the substrate surface is facilitated, uniformly spaced organic polymer backbones are formed on the surface, uniformly distributed metal salt is facilitated, and/or the formation of the active layer proceeds in a controllable manner.

In one embodiment, the spin on mixture contains from about 0.1% to about 75% by weight of organic semiconductor material, from about 0.1% to about 20% by weight of metal salt, and from about 25% to about 99.9% by weight of solvent (one or more of glycol ether esters, glycol ethers, furans, and alkyl alcohols). In another embodiment, the spin on mixture contains from about 0.5% to about 50% by weight of organic semiconductor material, from about 0.5% to about 15% by weight of metal salt, and from about 50% to about 99.5% by weight of solvent. In yet embodiment, the spin on mixture contains from about 1% to about 25% by weight of organic semiconductor material, from about 1% to about 10% by weight of metal salt, and from about 75% to about 99% by weight of solvent.

When applying the spin on mixture of organic semiconductor material, metal salt, and solvent to a wafer structure, the spin on mixture is at a temperature suitable to facilitate formation of the active layer, facilitate solubilization of the organic semiconductor material and metal salt, and/or permit easy removal of the solvent from the wafer substrate. In one embodiment, the temperature of the spin on mixture during application is from about 15° C. to about 80° C. In another embodiment, the temperature of the spin on mixture during application is from about 25° C. to about 70° C. In yet another embodiment, the temperature of the spin on mixture during application is from about 30° C. to about 60° C.

In one embodiment, the active layer has a thickness of about 0.001 µm or more and about 5 µm or less. In another embodiment, the active layer has a thickness of about 0.01 µm or more and about 2.5 µm or less. In yet another embodiment, the active layer has a thickness of about 0.05 µm or more and about 1 µm or less.

The resultant active layer formed using the spin on techniques contains the organic semiconductor material with the metal salt doped or substantially uniformly distributed therein. In one embodiment, the resultant active layer contains from about 50% to about 99.9% by weight of organic semiconductor material and from about 0.1% to about 50% by weight of metal salt. In another embodiment, the resultant active layer contains from about 60% to about 99% by weight of organic semiconductor material and from about 1% to about 40% by weight of metal salt. In yet another embodiment, the resultant active layer contains from about 70% to about 95% by weight of organic semiconductor material and from about 5% to about 30% by weight of metal salt. As more fully described below, clusters of charge carrier facilitators may partially or fully replace the metal salt in these concentrations in embodiments where the active layer is treated with an activating gas after it is formed.

In some instances, to promote the formation of charge carrier facilitators in the active layer and thus improved electrical characteristics including long charge retention times in the active layer, the active layer may be treated activating gas after it is formed. The creation of charge carrier facilitators modifies the energy barrier of the active layer. An active layer formed using the spin on techniques may be exposed to/contacted with hydrogen sulfide gas. The hydrogen sulfide reacts with the metal salt to form a metal sulfide. The metal sulfide is substantially uniformly distributed throughout the active layer. For example, when the metal salt is a copper salt or silver salt, exposure of an active layer formed using spin on techniques to hydrogen sulfide gas leads to the formation of copper sulfide or silver sulfide clusters in the active layer.

A covalent bond may be formed between the organic semiconductor material of the active layer and the passive layer. Alternatively, close contact is required to provide good charge carrier/electron exchange between the active layer and the passive layer. The active layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the active layer/passive layer interface, facilitate charge/carrier injection into the active layer, and/or increase the concentration of a charge carrier in the active layer. In some instances, the passive layer may store opposite charges thereby providing a balance of charges in the organic memory device as a whole. Storing charges/charge carriers is facilitated by the existence of two relatively stable oxidation states for the conductivity facilitating compound.

Generally, the conductivity facilitating compound or an atom in the conductivity facilitating compound has at least two relatively stable oxidation states. The two relatively stable oxidation states permit the conductivity facilitating compound to donate and accept charges and electrically interact with the active layer. The particular conductivity facilitating compound employed in a given organic memory cell is selected so that the two relatively stable oxidation states match with the two relatively stable oxidation states of the active layer. Matching the energy bands of two relatively stable oxidation states of the organic semiconductor and the conductivity facilitating compound facilitate charge carrier retention in the active layer.

Matching energy bands means that the Fermi level of the passive layer is close to the valence band of the active layer. Consequently, the injected charge carrier (into the active layer) may recombine with the charge at the passive layer if the energy band of the charged active layer does not substantially change. Matching energy bands involves compromising between ease of charge injection and length of charge (data) retention time.

In one embodiment, when matching energy bands, the Fermi level of the passive layer is within about 0.7 eV of the valence band of the active layer. In another embodiment, the Fermi level of the passive layer is within about 0.5 eV of the valence band of the active layer. In yet another embodiment, the Fermi level of the passive layer is within about 0.3 eV of the valence band of the active layer. In still yet another embodiment, the Fermi level of the passive layer is within about 0.15 eV of the valence band of the active layer. The valence band, in some instances, is the highest occupied molecular orbital (HOMO) of the subject material.

The applied external field can reduce the energy barrier between passive layer and active layer depending on the field direction. Therefore, enhanced charge injection in the forward direction field in programming operation and also enhanced charge recombination in reversed field in erase operation can be obtained. The presence of the metal salt at the amounts specified herein in the active layer further enhances both charge injection and charge recombination.

The passive layer may in some instances act as a catalyst when forming the active layer, particularly when the active layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers are self aligned in a direction that traverses the two electrodes. Moreover, the presence of the metal salt at the amounts specified herein in the active layer provides improved compatibility between the active layer and previously or subsequently formed layers, such as a passive layer and an electrode.

Examples of conductivity facilitating compounds that may make up the passive layer include one or more of copper sulfide ($Cu_2S$, CuS), copper rich copper sulfide ($Cu_3S/Cu_2S$, $Cu_3S/CuS$), copper oxide (CuO, $Cu_2O$), manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), nickel arsenide (NiAs), cobalt arsenide ($CoAs_2$), and the like. The conductivity facilitating compounds do not dissociate into ions under the strength of the electric field. The passive layer may contain two or more sub-passive layers, each sub-layer containing the same, different, or multiple conductivity facilitating compounds.

The passive layer may be grown using oxidation techniques, formed via gas phase reactions, implantation techniques, or deposited between the electrodes. In some instances, to promote long charge retention times (in the active layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 µm or less. In another embodiment, the passive layer has a thickness of about 10 Å or more and about 0.01 µm or less. In yet another embodiment, the passive layer has a thickness of about 50 Å or more and about 0.005 µm or less.

The metal of the metal salt of the active layer may be the same or different from the metal of the conductivity facilitating compound of the passive layer. In some instances, when the metal of the metal salt of the active layer is the same as the metal of the conductivity facilitating compound, enhanced compatibility is achieved within the memory cell. For example, when the conductivity facilitating compound of the passive layer is copper sulfide, the metal salt of the active layer is a copper salt.

In order to facilitate operation of the organic memory cells, the active layer is thicker than the passive layer. In one embodiment, the thickness of the active layer is from about 10 to about 500 times greater than the thickness of the passive layer. In another embodiment, the thickness of the active layer is from about 25 to about 250 times greater than the thickness of the passive layer.

The area size of the individual organic memory cells (as measured by the surface area of the two electrodes directly overlapping each other) can be small compared to conventional silicon based inorganic memory cells such as MOSFETs. In one embodiment, the area size of the organic memory cells of the present invention is about 0.0001 $µm^2$ or more and about 4 $µm^2$ or less. In another embodiment, the area size of the organic memory cells is about 0.001 $µm^2$ or more and about 1 $µm^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("on" state) permits an applied voltage to write or erase information into/from the organic memory cell and the presence of an external stimuli such as an applied electric field that is less than a threshold value permits an applied voltage to read information from the organic memory cell; whereas the absence of the external stimuli that exceeds a threshold value ("off" state) prevents an applied voltage to write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 2:
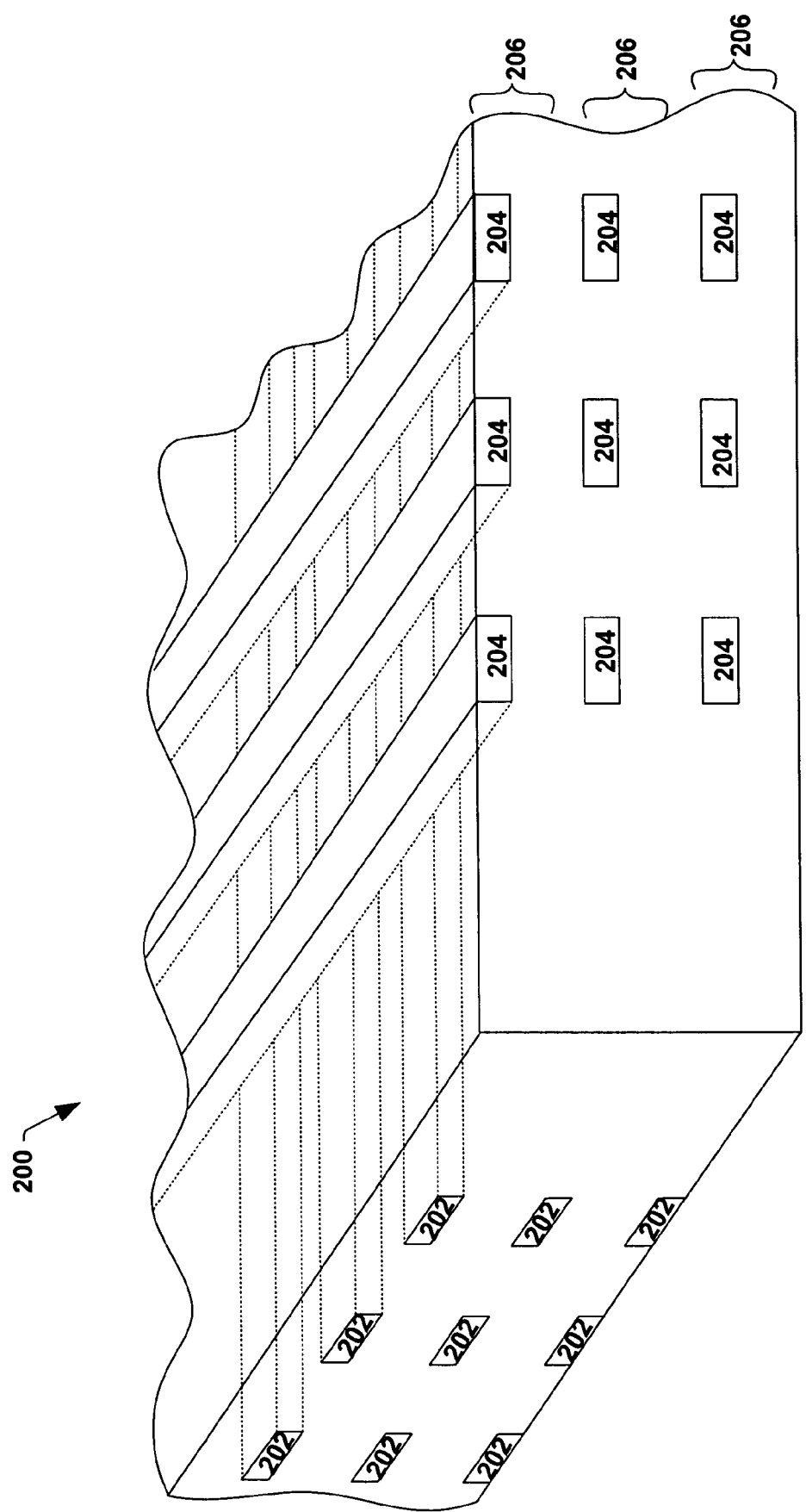
FIG. 2 illustrates a perspective view of a three dimensional microelectronic device containing a plurality of organic memory cells in accordance with another aspect of the invention.

Referring to FIG. 2, a three dimensional microelectronic organic memory device 200 containing a plurality of organic memory cells in accordance with an aspect of the invention is shown. The three dimensional microelectronic organic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an organic memory cell comprising:
    providing a first electrode;
    forming a passive layer comprising a conductivity facilitating compound over the first electrode;
    forming an active layer over the passive layer using a spin-on technique, the spin-on technique comprising applying a mixture of i) from about 0.1% to about 75% by weight of an organic semiconductor material, ii) from about 0.1% to about 20% by weight of an inorganic metal salt, and iii) from about 25% to about 99.9% by weight of at least one solvent selected from the group consisting of glycol ether esters, glycol ethers, furans, and alkyl alcohols containing from about 4 to about 7 carbon atoms;
    contacting the active layer with hydrogen sulfide gas to permit hydrogen sulfide to react with the inorganic metal salt to form a metal sulfide; and
    providing a second electrode over the active layer.

2. The method of claim 1, wherein the inorganic metal salt comprises at least one selected from the group consisting of copper salts, manganese salts, titanium salts, indium salts, gold salts, silver salts, iron salts, cobalt salts, nickel salts, palladium salts, platinum salts, zirconium salts, zinc salts, tungsten salts, molybdenum salts, and osmium salts.

3. The method of claim 1, wherein the inorganic metal salt comprises at least one selected from the group consisting of copper halogens, copper sulfate, copper persulfate, copper nitrate, and copper phosphate.

4. The method of claim 1, wherein the solvent comprises at least one glycol ether selected from the group consisting of poly(ethylene glycol) methyl ether, poly(ethylene glycol) ethyl ether, poly(ethylene glycol) propyl ether, poly(ethylene glycol) butyl ether, poly(propylene glycol) methyl ether, poly(propylene glycol) ethyl ether, poly(propylene glycol) propyl ether, poly(propylene glycol) butyl ether, ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, propylene glycol methyl ether, propylene glycol ethyl ether, propylene glycol butyl ether, propylene glycol dimethyl ether, propylene glycol diethyl ether, and propylene glycol dibutyl ether.

5. The method of claim 1, wherein the solvent comprises at least one glycol ether ester selected from the group consisting of ethylene glycol methyl ether acetate, ethylene glycol ethyl ether acetate, ethylene glycol propyl ether acetate, ethylene glycol butyl ether acetate, propylene glycol methyl ether acetate, propylene glycol ethyl ether acetate, propylene glycol propyl ether acetate, propylene glycol butyl ether acetate, poly(ethylene glycol) methyl ether acetate, poly(ethylene glycol) ethyl ether acetate, poly(ethylene glycol) propyl ether acetate, poly(ethylene glycol) butyl ether acetate, poly(propylene glycol) methyl ether acetate, poly(propylene glycol) ethyl ether acetate, poly(propylene glycol) propyl ether acetate, and poly(propylene glycol) butyl ether acetate.

6. The method of claim 1, wherein the solvent comprises at least one selected from the group consisting of tetrahydrofuran, n-butanol, iso-butanol, n-pentanol, iso-pentanol, cyclopentanol, n-hexanol, cyclohexanol, and heptanol.

7. The method of claim 1, wherein the active layer comprises at least one conjugated organic polymer selected from the group consisting of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis (trifluoromethyl)acetylene; polybis(t-butyldiphenyl) acetylene; poly(trimethylsilyl)diphenylacetylene; poly (carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polyfluorene; polyphenylene and alkyl- or alkoxy-substituted derivates thereof; polythiophene and alkyl- or alkoxy-substituted derivates thereof; polypyrrole; polysilane; polystyrene; polyfuran; polyindole; polyazulene; polyphenylene; polyfluorenes, polypyridine; polybipyridine; polyphthalocyanine; polysexithiophene; poly(silicon-oxohemiporphyrazine); poly(germaniumoxohemiporphyrazine); and poly(ethylenedioxythiophene).

8. The method of claim 1, wherein the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

9. A method of making an active layer for an organic memory cell comprising:
forming an active layer using a spin on technique, the spin on technique comprising applying to a surface a mixture of i) from about 0.1% to about 75% by weight of at least one of a conjugated organic polymer, ii) from about 0.1% to about 20% by weight of a metal salt selected from the group consisting of copper salts, manganese salts, titanium salts, indium salts, gold salts, silver salts, iron salts, cobalt salts, nickel salts, palladium salts, platinum salts, zirconium salts, zinc salts, tungsten salts, molybdenum salts, and osmium salts, and iii) from about 25% to about 99.9% by weight of at least one solvent selected from the group consisting of glycol ether esters, glycol ethers, furans, and alkyl alcohols containing from about 4 to about 7 carbon atoms; and
contacting the active layer with hydrogen sulfide gas to permit hydrogen sulfide to react with the inorganic metal salt to form a metal sulfide.

10. The method of claim 9, wherein the active layer is formed over a passive layer comprising a conductivity facilitating compound selected from the group consisting of copper sulfide, copper oxide, manganese oxide, titanium dioxide, indium oxide, silver sulfide, gold sulfide, nickel arsenide, cobalt arsenide, and iron oxide.

11. The method of claim 10, wherein the conductivity facilitating compound comprises a metal that is the same as the metal of the metal salt.

12. The method of claim 11, wherein the metal is copper.

13. The method of claim 9, wherein the conjugated organic polymer comprises at least one selected from the group consisting of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis (trifluoromethyl)acetylene; polybis(t-butyldiphenyl) acetylene; poly(trimethylsilyl)diphenylacetylene; poly (carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polyfluorene; polyphenylene and alkyl- or alkoxy-substituted derivates thereof; polythiophene and alkyl- or alkoxy-substituted derivates thereof; polypyrrole; polysilane; polystyrene; polyfuran; polyindole; polyazulene; polyphenylene; polyfluorenes, polypyridine; polybipyridine; polyphthalocyanine; polysexithiophene; poly(silicon-oxohemiporphyrazine); poly(germaniumoxohemiporphyrazine); and poly(ethylenedioxythiophene).

14. A method of making an organic memory cell comprising:
providing a first electrode;
forming a passive layer comprising a conductivity facilitating compound over the first electrode;
forming an active layer over the passive layer using a spin-on technique, the spin-on technique comprising applying a mixture of i) from about 0.1% to about 75% by weight of an organic semiconductor material, ii) from about 0.1% to about 20% by weight of a copper salt, and iii) from about 25% to about 99.9% by weight of at least one solvent selected from the group consisting of glycol ether esters, glycol ethers, furans, and alkyl alcohols containing from about 4 to about 7 carbon atoms;
contacting the active layer with hydrogen sulfide gas to permit hydrogen sulfide to react with the copper salt to form copper sulfide; and
providing a second electrode over the active layer.

15. The method of claim 14, wherein the solvent comprises at least one glycol ether selected from the group consisting of poly(ethylene glycol) methyl ether, poly(ethylene glycol) ethyl ether, poly(ethylene glycol) propyl ether, poly(ethylene glycol) butyl ether, poly(propylene glycol) methyl ether, poly(propylene glycol) ethyl ether, poly(propylene glycol) propyl ether, poly(propylene glycol) butyl ether, ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, propylene glycol methyl ether, propylene glycol ethyl ether, propylene glycol butyl ether, propylene glycol dimethyl ether, propylene glycol diethyl ether, and propylene glycol dibutyl ether.

16. The method of claim 14, wherein the solvent comprises at least one glycol ether ester selected from the group consisting of ethylene glycol methyl ether acetate, ethylene glycol ethyl ether acetate, ethylene glycol propyl ether acetate, ethylene glycol butyl ether acetate, propylene glycol methyl ether acetate, propylene glycol ethyl ether acetate, propylene glycol propyl ether acetate, propylene glycol butyl ether acetate, poly(ethylene glycol) methyl ether acetate, poly(ethylene glycol) ethyl ether acetate, poly(ethylene glycol) propyl ether acetate, poly(ethylene glycol) butyl ether acetate, poly(propylene glycol) methyl ether acetate, poly(propylene glycol) ethyl ether acetate, poly (propylene glycol) propyl ether acetate, and poly(propylene glycol) butyl ether acetate.

17. The method of claim 14, wherein the solvent comprises at least one selected from the group consisting of tetrahydrofuran, n-butanol, iso-butanol, n-pentanol, iso-pentanol, cyclopentanol, n-hexanol, cyclohexanol, and heptanol.

18. The method of claim 14, wherein the active layer comprises at least one conjugated organic polymer selected from the group consisting of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polyfluorene; polyphenylene and alkyl- or alkoxy-substituted derivates thereof; polythiophene and alkyl- or alkoxy-substituted derivates thereof; polypyrrole; polysilane; polystyrene; polyfuran; polyindole; polyazulene; polyphenylene; polyfluorenes, polypyridine; polybipyridine; polyphthalocyanine; polysexithiophene; poly(siliconoxohemiporphyrazine); poly(germaniumoxohemiporphyrazine); and poly(ethylenedioxythiophene).

19. The method of claim 14, wherein the conductivity facilitating compound comprises at least one selected from the group consisting of copper sulfide, copper oxide, manganese oxide, titanium dioxide, indium oxide, silver sulfide, gold sulfide, nickel arsenide, cobalt arsenide, and iron oxide.

20. The method of claim 14, wherein the active layer is formed over a passive layer comprising copper sulfide.

* * * * *